United States Patent
Narayan et al.

(10) Patent No.: US 6,288,436 B1
(45) Date of Patent: Sep. 11, 2001

(54) MIXED FUSE TECHNOLOGIES

(75) Inventors: Chandrasekhar Narayan, Hopewell Junction; Kenneth Arndt, Fishkill; Toshiaki Kirihata, Poughkeepsie, all of NY (US); David Lachtrupp, Waterbury Center, VT (US); Axel Brintzinger, Fishkill; Gabriel Daniel, Jamaica Estates, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/361,960

(22) Filed: Jul. 27, 1999

(51) Int. Cl.$^7$ ................................................ H01L 29/00
(52) U.S. Cl. ........................ 257/529; 438/601; 327/525
(58) Field of Search ..................................... 257/529, 530; 438/600, 601; 365/200; 327/525

(56) References Cited

U.S. PATENT DOCUMENTS

| | | | |
|---|---|---|---|
| 5,066,998 | 11/1991 | Fischer et al. | ............................ 357/51 |
| 5,285,099 | 2/1994 | Carruthers et al. . | |
| 5,314,840 | 5/1994 | Schepis et al. . | |
| 5,340,775 | 8/1994 | Carruthers et al. . | |
| 5,428,571 | * 6/1995 | Atsumi et al. | ................... 365/189.05 |
| 5,485,032 | 1/1996 | Schepis et al. . | |
| 5,548,555 | * 8/1996 | Lee et al. | ............................... 365/200 |
| 5,748,031 | * 5/1998 | Best | ........................................ 327/525 |
| 5,818,748 | * 10/1998 | Bertin et al. | ............................ 365/51 |
| 5,973,380 | * 10/1999 | Cutter et al. | .......................... 257/530 |
| 5,986,319 | * 11/1999 | Huggins | ................................ 257/529 |
| 6,060,942 | * 5/2000 | Oh | ........................................ 327/536 |

FOREIGN PATENT DOCUMENTS 6-325589    11/1994    (JP) .

* cited by examiner

Primary Examiner—Steven Loke
Assistant Examiner—Douglas W. Owens
(74) Attorney, Agent, or Firm—H. Daniel Schnurmann

(57) ABSTRACT

A plurality of fuses of different types, each type of fuse serving a specific purpose are positioned on a semiconductor integrated circuit wafer, wherein activating one type of fuse does not incapacitate fuses of a different type. Fuses of the first type, e.g., laser activated fuses, are primarily used for repairing defects at the wafer level, whereas fuses of the second type, e.g., electrically activated fuses, are used for repairing defects found after mounting the IC chips on a module and stressing the module at burn-in test. Defects at the module level typically are single cell failures which are cured by the electrically programmed fuses to activate module level redundancies.

13 Claims, 4 Drawing Sheets

MIXED FUSE TECHNOLOGIES

FIELD OF THE INVENTION

This invention is related generally to fuses and, more particularly, to combining laser activated fuses and electrically activated fuses on the same integrated circuit chip, module or wafer in order to enhance the yield of a semiconductor package.

BACKGROUND OF THE INVENTION

It is known in the art that various fuse technologies, such as electrically activated or laser activated fuses have been advantageously used over the years in a variety of products. Attempts have been made in the past to interconnect fuses of different fuse technologies in the same circuitry to benefit from the advantages offered by the different types of fusing technologies. By way of example, in U.S. Pat. No. 5,748,031 issued to Best, a laser fuse and an electrical fuse are interconnected in series in the same circuit such that fusing is accomplished by either using a laser to blow one fuse or passing a current and programming the fuses in series with it. In another example, in U.S. Pat. Nos. 5,485,032 and 5,314,840 to Schepis et al., of common assignee, a fuse is described which can be optically programmed by laser or blown by an electrical current and which exhibits a change in resistance when compared to an unprogrammed fuse, wherein the change in resistance is induced by alloying aluminum and germanium. In yet another example, in U.S. Pat. Nos. 5,340,775 and 5,285,099 to Carruthers et al., and of common assignee, a SiCr fuse is described having the dual purpose of serving as a fuse which can be optically or electrically programmed. In still another example, in Japanese Patent 6-325589 issued in 1994, a circuit is described which contains laser and electrical fuses wherein laser fuses are used to control the electrical fuses to reduce total circuit area. Here again a laser and an electrical fuse are electrically coupled to each other, allowing one to control the other.

Linking laser activated fuses to electrically activated fuses in the same circuit has a distinct disadvantage in that having the same number of laser fuses and electrical fuses in each circuit imposes a severe penalty in the amount of chip real estate that is consumed. Alternatively, if only some laser fuses were coupled on the same circuit to electrical type fuses, much of the flexibility in activating redundancies would be lost since only those laser fuses that are unattached at the wafer level could be used in order not to render any electrical fuse unusable later on at the module level.

Laser activated fuses are known to be much reliable than electrical fuses. Yet, several drawbacks, fully described in, e.g., the aforementioned U.S. Pat. No. 5,748,031, makes them less desirable than electrical fuses. By way of example, laser programmable fuses have a distinct disadvantage of requiring optical contact to blow the fuse. More specifically, the laser programmable fuse must be placed on the chip with its link fuse exposed by a window to allow the beam to break the link whenever programming is desired. However, once the chip is placed in a module or in some other second level package, the window is no longer accessible and the laser fuse can no longer be programmed at will. Thus, laser activated fuses are useful only to chips, namely, to pre-packaged integrated circuit (IC) devices but not to chips mounted on a module.

Electrically programmable fuses have the advantage of being easily programmed no matter where the fuses are located, whether on a chip, module, and the like, with the window exposed or whether placed deep inside the semiconductor structure. Electrical fuses use bonding pads to interface with fuse zapping tools. These pads can be placed outside the package, which provides the added flexibility of blowing the fuse regardless whether or not the IC chip is mounted on the next level of packaging. Yet, they have the distinct disadvantage of occupying a substantial amount of chip real estate, a serious drawback, particularly in high density integrated circuit chips.

OBJECTS OF THE INVENTION

It is, therefore, an object of the invention to combine laser activated fuses and electrically activated fuses on the same integrated circuit device, in order to enhance the overall product yield.

It is another object of the invention to keep the optically programmable fuses and the electrically programmable fuses electrically separated from one another, such that programming can be take performed on either type of fuse, independently of the other.

It is still another object of the invention to have laser fuses and electrical fuses present in a chip in a proportion such that laser fuses are used to eliminate fabrication defects by replacing arrays with corresponding redundancy sub-arrays, units and the like, and where electrical fuses are used to cure defects detected during final test or burn-in test applicable to modules, and other such second level packages.

SUMMARY OF THE INVENTION

In essence, the present invention provides a plurality of fuses of different types on a semiconductor wafer or module, each type of fuse serving a specific purpose, wherein activating one type of fuse does not render fuses of a different type inactive.

In one aspect of the invention, there is provided a fuse arrangement on a semiconductor integrated circuit wafer or module that includes: at least one fuse of a first fuse type and at least one fuse of a second fuse type, the fuses of the first and second types being unconnected from one another.

In a second aspect of the invention there is provided a fuse arrangement on a semiconductor integrated circuit wafer or module that includes: fuses of a first fuse type for repairing a first type of defects; and fuses of a second fuse type for repairing a second type of defects, the fuses of the first and second fuse types being unconnected from one another.

The various objects of the invention are also attained by a method of arranging different type of fuses on a semiconductor integrated circuit wafer or module that includes the steps of providing fuses of a first fuse type for repairing a first type of defects; and providing fuses of a second fuse type for repairing a second type of defects, the fuses of the first and second fuse types being unconnected from one another.

BRIEF DESCRIPTION OF THE DRAWINGS

The foregoing and other objects, aspects and advantages of will be better understood from the following detailed description of a preferred embodiment of the invention with reference to the drawings, in which.

DETAILED DESCRIPTION OF A PREFERRED EMBODIMENT OF THE INVENTION

The present invention describes a structure wherein two different, mutually exclusive fusing technologies are utilized on the same chip for different purposes. The combination could be laser and electrical fuses or laser and anti-fuses or electrical fuses and anti-fuses in any combination of standard fusing technologies used in the semiconductor industry. The preferred embodiment described herein uses standard programmable laser fuses and programmable electrical fuses. The combination is used with the specific task of enhancing overall product yield. While each of these fuse technologies would, in principle, be sufficient to do all the fusing required, a distinct advantage results from using laser fuses at the chip level, as is the practice today in most of the DRAM industry, although such fuses cannot repair any defects resulting once the chip has been mounted on the next level of packaging. In such cases, defective chips are routinely discarded. On the other hand, the use of electrical fuses to satisfy all fusing needs results in the expenditure of a chip area much larger than necessary because of the need to use transistors capable of carrying the high current necessary to blow the fuses. However, it is possible to use a judicious mix of these two technologies, whereby standard laser fuses are used as it is currently practiced to repair a majority of the defects resulting from the fabrication process, leaving selected few electrical fuses to eliminate a residual number of defects that may appear after packaging and stressing. (Note: the term "repairing defects" will be used hereinafter with the understanding that such a repair is typically performed by having the fuses bypass defects on the wafer or module.)

Placing fuses of different types side by side finds its best application in activating redundancy units within IC devices, such as DRAMs. For instance, a 256 Mb DRAM may need 8000 laser fuses and 100 electrical fuses. Because the number of electrical fuses is so small no area penalty for the chip is imposed, and still, at the same time, they can be used to correct defects that exist after mounting the chip on a module and stressing the package by way of burn-in test.

Figure 1:
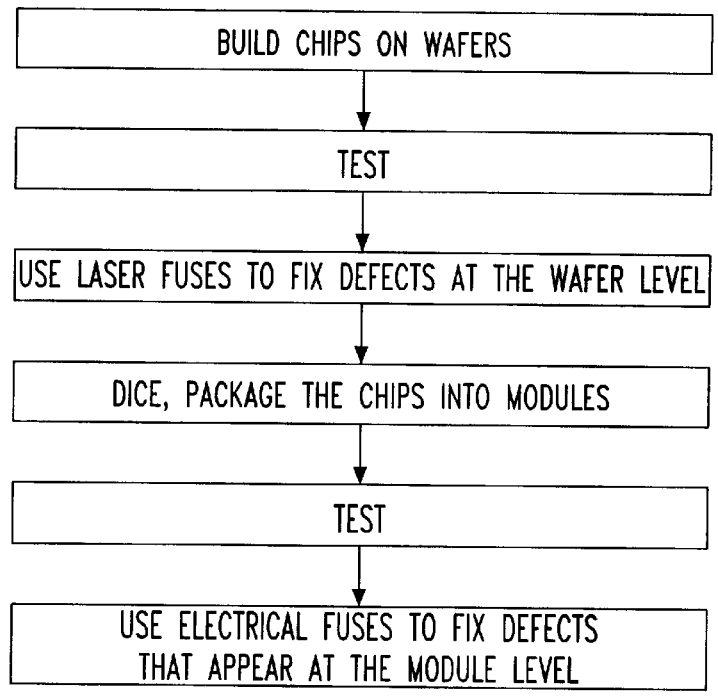
FIG. 1 is a block diagram of a conventional wafer test and repair process flow that uses laser fuses and electrical fuses.

A typical process flow is shown in FIG. 1. Herein, laser fuses are employed at the wafer stage. After completing all the repairs, the wafer is diced to break the wafer into individual chips, which are then packaged (i.e., mounted on a module), stressed and tested. At this stage, any additional defects found cannot be eliminated by laser fuses since the packaging compound now completely covers the chip. However, electrical fuses can now be used to activate any additional redundancies by contacting the appropriate package leads.

Figure 2:
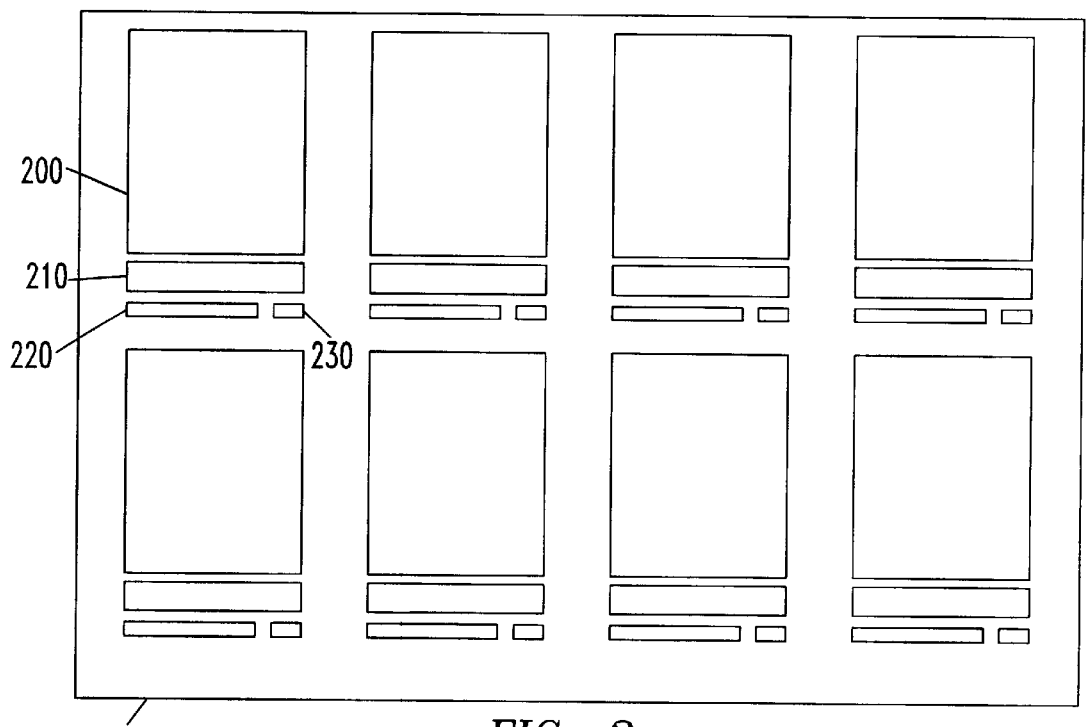
FIG. 2 is a block diagram of a conventional 256 Mb DRAM chip with eight 32 Kb sub-arrays and associated redundancy arrays activated by mixed technology fuses.

A typical layout is shown in FIG. 2. Herein, a primary array, a redundant array and fuse elements are shown. Ideally, either laser or electrical fuses can be used to activate the redundant elements. Shown in FIG. 2 are a 256 Mb DRAM chip 100, eight 32 Mb sub-arrays 200, and redundancy arrays 210 associated with each of the sub-arrays 200. Below the sub-arrays are shown fuse blocks which consist of laser fuses 220 and electrical fuses 230. In the present embodiment, the fuse blocks consist of 8000 laser fuses organized in blocks of 1000 fuses each, referenced with numeral 220, and 10 electrical fuses per block referenced with numeral 230.

The aforementioned example can be further generalized by considering that it is desirable to mix the various fuse technologies in an ideal mix, wherein the number of defects of one kind which are most advantageously repaired by fuses of a first type are present in the best possible proportion when compared to defects of a second type which are cured by fuses of another type. For instance, in a 1 Gb DRAM, 200,000 laser fuses can repair any defects requiring replacing defective sub-arrays with redundant ones. Once the laser fuses have been programmed and the DRAM chip found to be defect free, the chip is tested and burned-in to remove early life defects which typically affect the reliability of the chip during early stages of its life. To this purpose, an additional 100 electrical fuses should be incorporated to the package containing the DRAM chip in order to repair any defects due to fall-out at burn-in, and which typically do not amount to more than perhaps some 5–10 defects.

The Fabrication Process

The fabrication of a semiconductor chip with two different fuse technologies is described below.

Figure 3A:
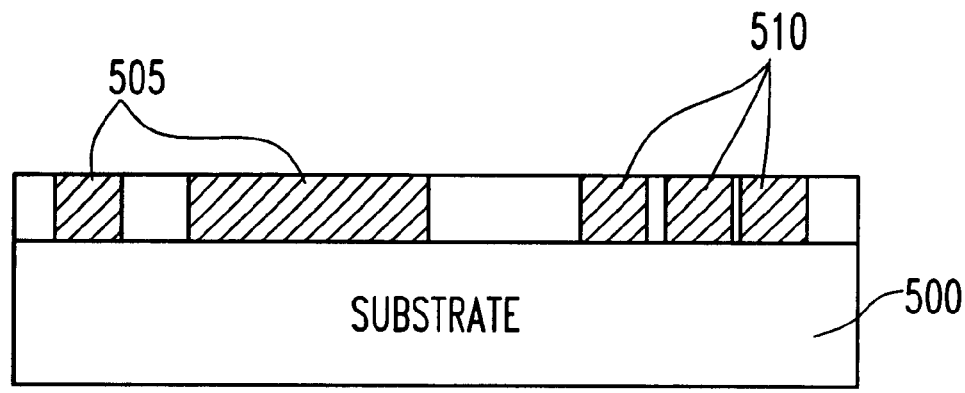
FIGS. 3a–3b, 4a–4b and 5 illustrate the various process steps required to manufacture a plurality of mixed technology fuses, e.g., electrical and laser fuses, in accordance with the invention.
Figure 3B:
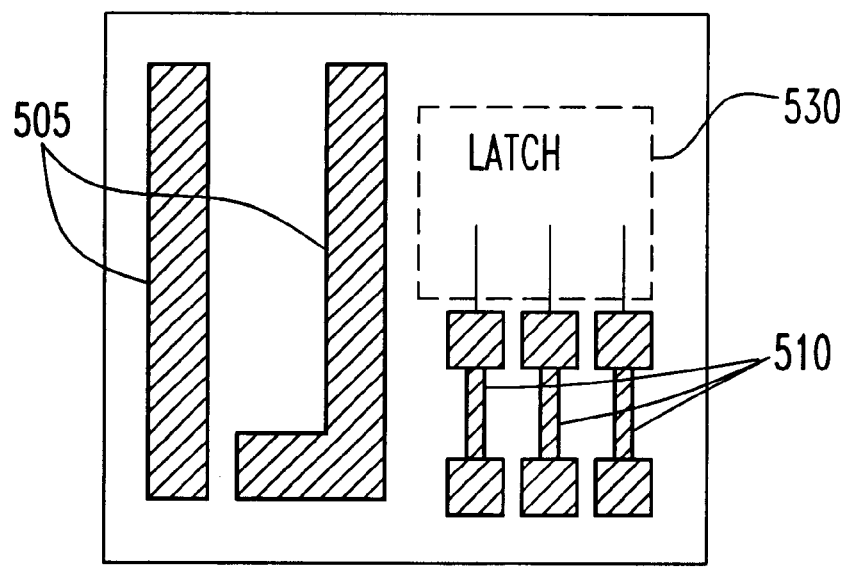

FIG. 3a shows a cross-section of a semiconductor chip showing the electrical fuses fabricated on the first metallization level. Substrate, labeled 500, is assumed to be fully populated with all the circuits and devices that are typical of such devices. Electrical fuses are placed on the first level of metallization, which is typically used to personalize the chip, and which is commonly referred in the DRAM industry as the gate conductor level. In FIG. 3a, 505 refers to the gate conductor wires and 510 are the electrical fuses. This is also shown in FIG. 3b, a top-down view of the electrical fuses described in FIG. 3a. The electrical fuses 510 are positioned at the bottom right corner of the chip and connected to the latch circuitry 530. Subsequent to this level, other electrical wiring and vias are fabricated, as will be explained hereinafter.

Figure 4A:
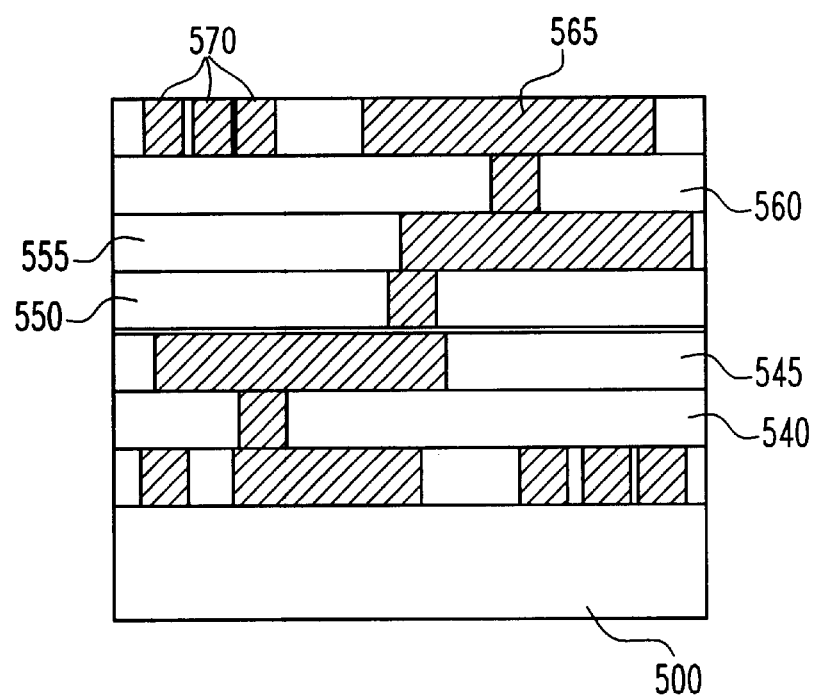

FIG. 4a shows a cross-sectional view of the same semiconductor chip that was described with reference to FIG. 3, with several levels already built. The laser fuses are shown on the top level. Numerals 540, 550 and 560 represent the via levels in the multi-layer structure, while numerals 545, 555 and 565 refer to the wiring levels (or layers). In this embodiment, wiring level 565 is also used for laser fuses 570 (in FIG. 4a).

Figure 4B:
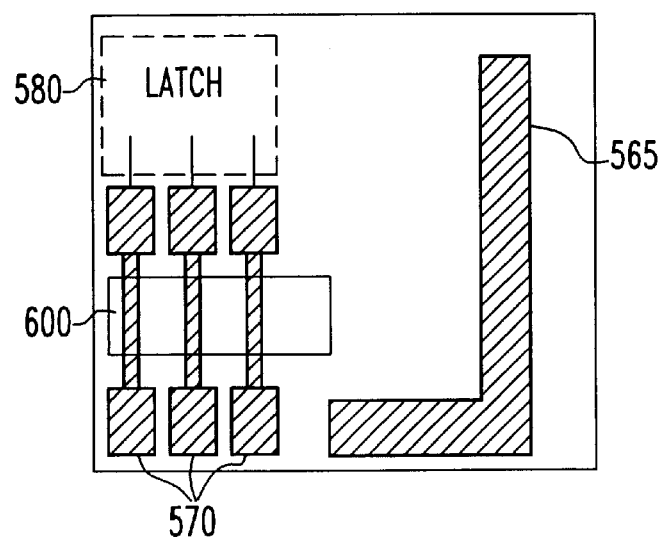
Figure 5:
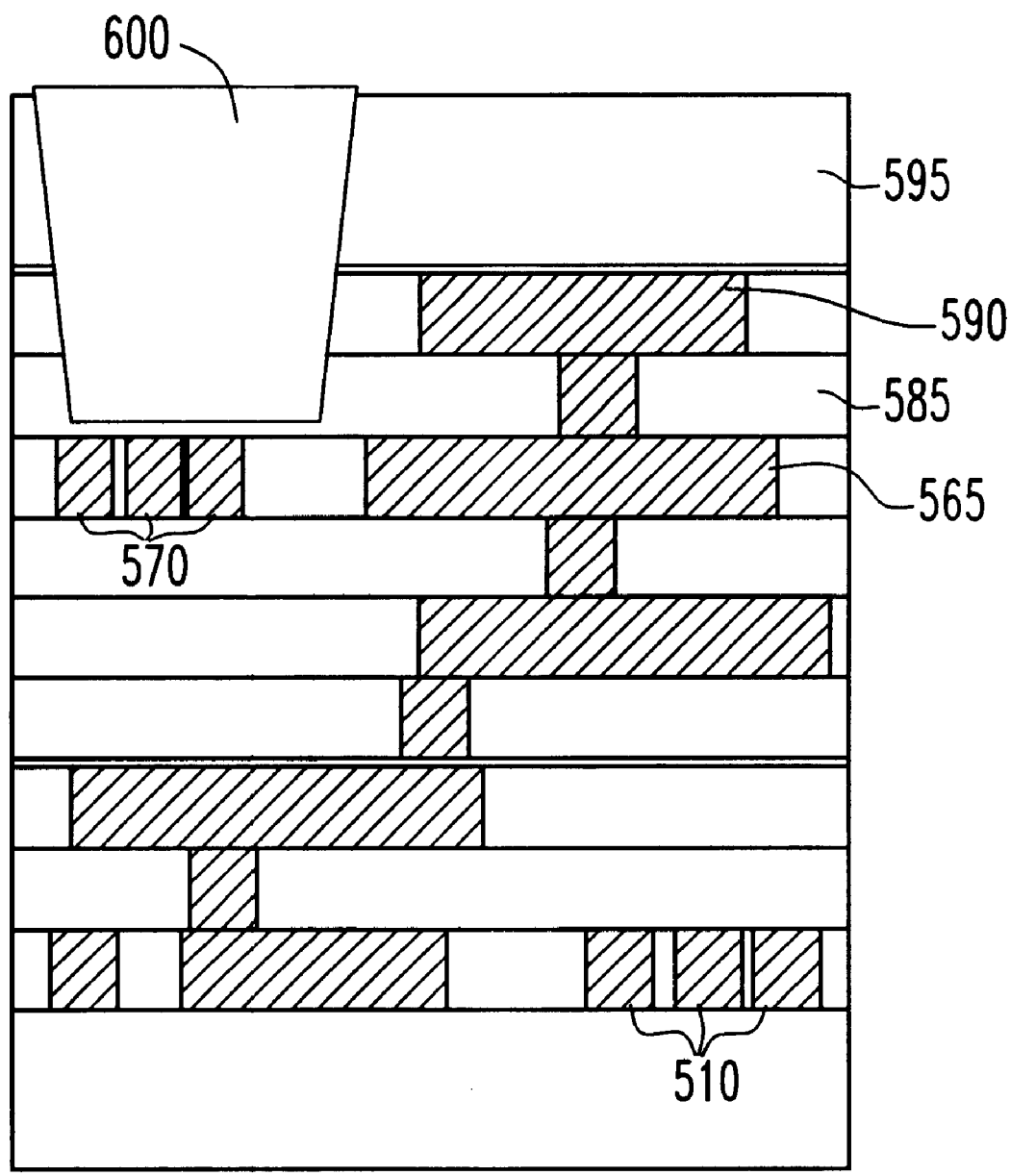

FIG. 4b shows a top-down view of the chip after level 565 has been fabricated. Herein, laser fuses 570 are placed on one side of each chip, and more specifically in the bottom left corner. The fuses are connected to a different set of latches 580. The latch 580 is shown to be in a different location than latch 530 to emphasize the fact that the two sets of circuits are not interdependent or interconnected. After this interconnect level is completed, additional wiring levels may be deposited FIG. 5 shows a cross-sectional view of the completed structure of the chip. The electrical fuses are shown near the bottom, while the laser fuses are shown positioned near the top. The aforementioned additional wiring level consists of via level 595 and final wiring level 590. A passivation layer (not shown) is deposited on top of the final wiring level, oftentimes a combination of silicon oxide and silicon nitride layers followed by a polymer protective insulating layer. Additionally, an opening 600 is etched out from the top, down to the region where the laser fuses 570 are located. This is also shown in FIG. 4b, wherein the location of opening 600 is delineated.

In the previously described example, electrical fuses are shown on the gate conductor level and laser fuses are depicted on a metal interconnect level near the top of the chip. Actually, the electrical fuses may be positioned on any wiring level, even in the substrate where a polysilicon fuse can be used. Likewise, the laser fuse can also be located on any wiring level. The actual location of the electrical fuses is often dictated by the resistance of the different wiring levels while the location of the laser fuses are determined more by the metal thicknesses of the different wiring levels and the ease of etching an opening through the passivation layers over the laser fuses links.

While the invention has been illustrated and described with respect to a preferred embodiment, it is understood by those skilled in the art, that the invention is not limited to those precise constructions herein disclosed, and the right is reserved to all changes and modifications coming within the scope of the invention as defined in the appended claims.

What is claimed is:

1. A fuse arrangement on a semiconductor integrated circuit wafer or module comprising:

at least one fuse of a first fuse type; and at least one fuse of a second fuse type, said fuses of said first and second types being unconnected from one another.

2. The fuse arrangement as recited in claim 1, wherein fuses of said first type individually repair defects on said wafer, and fuses of said second type individually repair defects on said module, said fuses of said first type repairing said defects without affecting said fuses of said second type, and vice versa.

3. The fuse arrangement as recited in claim 1, wherein said at least one fuse of said first fuse type is a laser activated fuse and said at least one fuse of said second fuse type is an electrically activated fuse.

4. The fuse arrangement as recited in claim 3, wherein said semiconductor integrated circuit wafer is provided with a plurality of wiring levels, said electrically activated fuses and said laser activated fuses being positioned on any of said plurality of wiring levels.

5. The fuse arrangement as recited in claim 4, wherein the location of said electrically activated fuses is determined by the resistance associated with said wiring level and the location of said laser activated fuses is determined by the metal thickness of said wiring levels.

6. The fuse arrangement as recited in claim 1, wherein said fuses of said first type are activated prior to mounting said semiconductor integrated circuit substrate on a second level package, whereas said fuses of said second type are activated after mounting said semiconductor integrated circuit substrate on a second level package.

7. The fuse arrangement as recited in claim 1, wherein said fuse of said first type repairs defects of a first type and said fuse of said second type repairs defects of a second type.

8. The fuse arrangement as recited in claim 7, wherein said defects of a first type comprise defects generated during fabrication of said wafer, and said defects of said second type are defects generated while stressing said module.

9. A fuse arrangement on a semiconductor integrated circuit chip, the chip having a plurality of wiring levels, the fuse arrangement comprising:

fuses of a first type being positioned on a first number of said wiring levels; and fuses of a second type being positioned on a second number of said wiring levels, said fuses of said first type and said fuses from said second type being disconnected from one another.

10. A fuse arrangement on a semiconductor integrated circuit wafer or module comprising:

fuses of a first type for repairing a first type of defects; and fuses of a second type for repairing a second type of defects, said fuses of said first type and said fuses from said second type being disconnected from one another.

11. The fuse arrangement as recited in claim 10, wherein said fuses of said first type are laser activated fuses and said fuses of said second type are electrically activated fuses.

12. The fuse arrangement as recited in claim 10, wherein said first type of defects are wafer defects, and said second type of defects are module defects.

13. The fuse arrangement as recited in claim 10, wherein said defects of said first type are defects requiring activating chip redundancy means, whereas said defects of said second type are single cell fails requiring activating module level redundancies.

* * * * *